United States Patent [19]
Crouch et al.

[11] Patent Number: 5,592,493
[45] Date of Patent: Jan. 7, 1997

[54] SERIAL SCAN CHAIN ARCHITECTURE FOR A DATA PROCESSING SYSTEM AND METHOD OF OPERATION

[75] Inventors: Alfred L. Crouch; Matthew D. Pressly, both of Austin, Tex.; Joseph C. Circello, Phoenix; Richard Duerden, Scottsdale, both of Ariz.

[73] Assignee: Motorola Inc., Schaumburg, Ill.

[21] Appl. No.: 304,968

[22] Filed: Sep. 13, 1994

[51] Int. Cl.$^6$ ................................................. G01R 31/28
[52] U.S. Cl. ...................... 371/22.3; 371/22.1; 371/22.5; 371/25.1; 324/73.1
[58] Field of Search .................... 371/25, 22.3, 22.1, 371/22.4, 21.1, 25.1, 22.5, 22.6; 324/73 R

[56] References Cited

U.S. PATENT DOCUMENTS

| | | | |
|---|---|---|---|
| 4,860,290 | 8/1989 | Daniels et al. | 371/25 |
| 4,905,142 | 2/1990 | Matsubara et al. | 364/200 |
| 4,947,395 | 8/1990 | Bullinger et al. | 371/22.3 |
| 5,041,742 | 8/1991 | Carbonaro | 307/452 |
| 5,047,710 | 9/1991 | Mahoney | 324/158 |
| 5,054,024 | 10/1991 | Whetsel | 371/22.3 |
| 5,097,206 | 3/1992 | Perner | 324/158 |
| 5,107,501 | 4/1992 | Zorian | 371/213 |
| 5,119,202 | 6/1992 | Hashimoto et al. | 358/213.11 |
| 5,181,191 | 1/1993 | Farwell | 368/113 |
| 5,202,978 | 4/1993 | Nozuyama | 395/575 |
| 5,220,281 | 6/1993 | Matsuki | 324/158 |
| 5,229,657 | 7/1993 | Rackley | 307/443 |
| 5,230,000 | 7/1993 | Mozingo et al. | 371/22.4 |
| 5,258,986 | 11/1993 | Zerbe | 371/21.2 |
| 5,260,649 | 11/1993 | Parker et al. | 324/158 |
| 5,260,947 | 11/1993 | Posse | 371/22.3 |
| 5,260,948 | 11/1993 | Simpson et al. | 371/22.3 |
| 5,260,949 | 11/1993 | Hashizume et al. | 371/22.3 |
| 5,260,950 | 11/1993 | Simpson et al. | 371/22.3 |
| 5,285,153 | 2/1994 | Ahanin et al. | 324/22.1 |
| 5,325,367 | 6/1994 | Dekker et al. | 371/21.1 |
| 5,428,622 | 6/1995 | Kuban et al. | 371/22.3 |

Primary Examiner—Hoa T. Nguyen
Assistant Examiner—Nadeem Iqbal
Attorney, Agent, or Firm—Keith E. Witek

[57] ABSTRACT

A scan chain architecture which has a controller (10), and a multiplexer (24) is used to route test data through functional units (12, 14, 16, 18, 20, and 22). The controller (10) receives as input a serial data stream from an STDI terminal and demultiplexes this data stream to one of the functional units (six functional units are illustrated in FIG. 1). Each of the functional units is considered as one scan chain and therefore FIG. 1 has six scan chains (one for each functional unit). In addition, a seventh scan chain couples all output flip-flops in each of the functional units together between an output of the MUX (24) and the STDO terminal/pin. Therefore, a serial scan of a data stream can be done through one functional unit, the multiplexer (24) and into the output flip-flops of each function unit to make testing easier to set-up. In addition, various new scan chain cells and low power methods are used herein.

28 Claims, 7 Drawing Sheets

DELAY FAULT TIMING SCAN

SERIAL SCAN CHAIN ARCHITECTURE FOR A DATA PROCESSING SYSTEM AND METHOD OF OPERATION

FIELD OF THE INVENTION

The present invention relates generally to data processing systems, and more particularly, to serial scan chains in a data processing system.

BACKGROUND OF THE INVENTION

In modern integrated circuit design, a microprocessor is designed in functional blocks, each of which perform a certain task. Some functional blocks are, for example, a prefetch unit, a pipeline execution unit, a cache, a bus interface unit, a floating point execution unit, and the like. These functional blocks have many inputs and output which are coupled to other inputs and outputs of other functional blocks which are not accessible by external pins/terminals. Therefore, if one would want to test, for example, an operand cache unit in isolation, the task would be very complex since the inputs and outputs of the operand data cache (or any functional block for that matter) cannot be accessed readily via the integrated circuit external pins/terminals. In addition, since the external pins/terminals do not have direct access to a functional block's inputs and outputs, setting initial test conditions and reading test results or output values is extremely complicated. A method for testing functional blocks in an efficient manner is needed.

Figure 1:
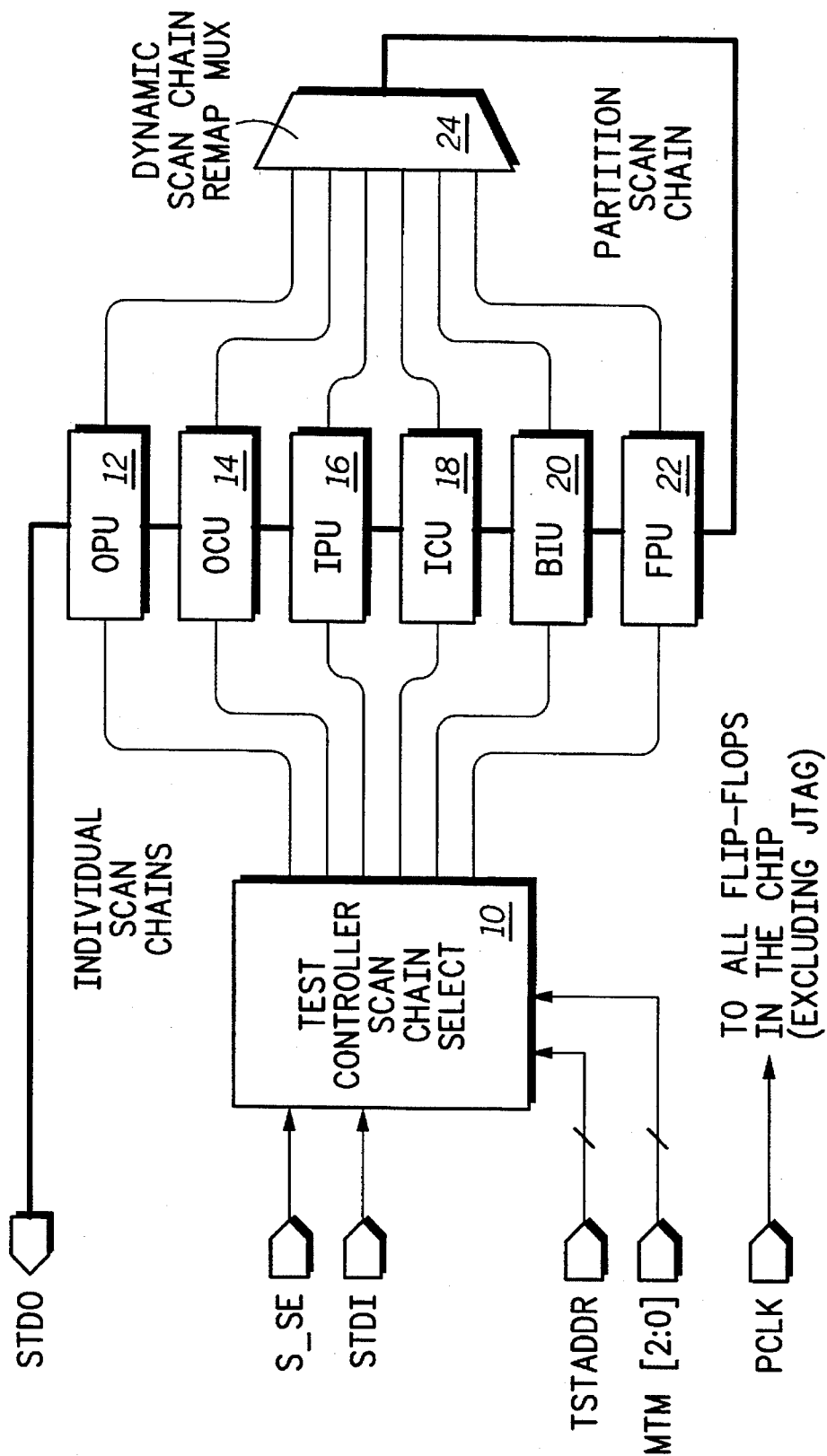
FIG. 1 illustrates, in a block diagram, a serial scan chain architecture in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

In order to understand the present invention, the next several pages will discuss scan architecture and methods in an overview manner. In addition, in the following first few paragraphs, the prior art is compared to the method taught herein in order to differential on a global scale some major differences without going into exact detail. Following these introductory paragraphs, the FIGURES are discussed in detail to specifically discuss the novel scan method and structure.

The present invention provides a scan test architecture for use with a full-scan partitioned logic design (a plurality of functional circuit blocks within a single integrated circuit) implementation that is based upon a single serial scan access port with a single scan shift control port and can conduct scan tests at or above the rated frequency of the integrated circuit in such a manner that frequency dependent faults can be detected and isolated within any targeted partition block within the integrated circuit (IC).

Generally, a FULL-SCAN TEST ARCHITECTURE can be designed into any integrated circuit that is structured so that all of the sequential elements (flip-flops or latches) in the circuit have both a normal data input for a normal mode of computational operation and a scan data input wherein all scan data inputs are coupled in series via a scan path. The serial connection of all the flip-flops or latches via a scan path forms a typically large scan shift register which may be anywhere from two flip-flops in length to thousands of flip-flops in serial length. This serial coupling of storage elements (flip-flops, latches, registers, and the like) allows the state of the integrated circuit to be set to any initial state by serially shifting data into the sequential elements. Once the state is set via the serially shifting through scan data in pins, the circuit can be run in the normal mode of operation (not the scan mode of initial state set-up) for one or more clock cycles to capture the circuits response to the previously scanned-in state.

In many integrated circuits, the scan mode is changed to the normal mode of parallel operation by transitioning a control signal that makes the sequential elements capture data from their functional inputs (normal data inputs) instead of the scan shift inputs. The application of serial state data, transitioning of the control signal or signals, and the collection of the serial response data (i.e., the output of the circuit in response to the initial state) is usually conducted by a tester external to the circuit (such as an Advantest or a Teradyne tester) although built in self test (BIST) is possible and more autonomous.

Therefore, the minimum requirements of a simple FULL-SCAN TEST ARCHITECTURE is to (1) provide the serial input to the internal serial scan shift register, (2) to provide the scan shift/sample control signal, (3) to provide the connections between sequential elements that allow the scan shift register to be constructed, and (4) to provide the serial output of the scan shift register.

Since the inclusion of a simple FULL-SCAN TEST ARCHITECTURE in an integrated circuit design has significant circuit costs in: (1) physical substrate area; (2) transistor and/or logic element count; and (3) performance, there must be some advantage to using it as opposed to other test architectures and methodologies. The most common reasons for newer ICs being designed having a scan architecture are consistency of design and use and independence of application (i.e., any digital circuit regardless of function can be tested by a scan test methodology and tested in a consistent fashion regardless of function). The reduction of test vector generation time by the use of software automatic-test-pattern-generation tools (ATPG), and the reduction of test pattern application time on the tester (thereby reducing the cost of testing) are also advantages of a scan architecture.

There are, however, some cases and conditions that exist where the simple FULL-SCAN TEST ARCHITECTURE is not sufficient to provide the advantages stated above. For example: (1) the number of logic gates on the IC is so large that an ATPG tool cannot operate on the whole device as a single unit; (2) the placing of all sequential elements into a single scan shift register would create a serial sequential depth that exceeds the reasonable memory depth of the tester and requires a long time period to shift in the individual vectors; (3) the existence of non-standard logic constructs such as global chip distributed three-state busses or tri-state buses that can have multiple drivers "in contention" during scan testing; (4) the requirement to speed sort the device by verifying that certain "speed paths" meet their clock-edge to clockedge window; and (5) the requirement to support fault classes other than the single stuck-at fault model that is predominantly associated with scan testing (for example bridging faults, gate AC delay faults, current leakage faults, and path AC delay faults). The above criterion render many prior art scan methods less desirable.

Therefore, a true all-encompassing, widely accepted, and advantageous FULL-SCAN TEST ARCHITECTURE must provide the capability to not only scan test the device, but to provide solutions to all of the adverse conditions listed above. The scan architecture described in the FIGURES herein provides all of these capabilities in a manner wherein many functional elements are shared with scan test elements so that far fewer logical circuit elements are used than the current known state of the art scan implementations.

In overview, the system and method described herein uses a functionally partitioned, multiple selectable, scan chain architecture with a common concatentable "functional" boundary (or partitioning) scan chain, where all of the sequential elements and three-state drive devices used are from a specific restricted set of logic elements. This specific FULL-SCAN TEST ARCHITECTURE provides the capability to independently test a plurality of functional blocks from a single scan test port, one block at a time, where testing occurs at the rated device frequency (or in excess of the rated frequency) of the processor. Therefore, this method and scan architecture minimizes the pin impact of the IC and the test interface requirements to the tester while keeping the logic-under-test size reasonable for an automatic-test-pattern-generation (ATPG) software tool. In addition, the scan chain methodology taught herein incorporates various low power options not available in previous scan methods. The scan method taught herein is significantly different from scan chain architectures that are based on the LSSD methodology which requires a latched base scan chain and multiple test clocks, or clocked flip-flop based scan that relies on gated clock signals to perform the logic partitioning.

In the method/architecture taught herein, the overall IC device is partitioned into smaller disjoint functional blocks where each functional block has its own independent scan chain. All of these independent scan chains are coupled in a parallel manner as illustrated in FIG. 1 herein. Each functional block can undergo testing separately and independently and allows a level of diagnostic isolation within that block. The partitioning of the IC device into disjoint functional blocks for test purposes is problematic in itself since it now creates a set of input and output signals that are buried within the device and are not directly accessible to the external package pins. For example, a bus interface unit (BIU) may be one internal functional block while a operand cache unit (OCU) may be a different functional isolated block wherein each have their own scan chains. Each of the BIU and the OCU may have block inputs and block outputs that are not accessible by I/O pins, input pins, and/or output pins of the integrated circuit (IC) package. In order to conduct scan testing on a partitioned block, the internal sequential elements must be set to a known state by the scan shift operation while simultaneously applying logic signals to the block input signals which may come from some other functional block. This problem is solved herein by the addition of a "partitioning" block output scan chain to the architecture.

After the scan sample cycle (i.e., the testing of the IC by applying clock cycle(s) after scanning in initial data), the state of the scan chain must be shifted out while the state of the partitioned block's outputs are being observed. The problem of providing the inputs to the block was solved by understanding that the inputs to the partitioned block under test come from the outputs of other partitioned functional blocks or directly from the IC package pins. Therefore, collecting all of the output signals of each functional block into a single "partitioning" scan chain and dynamically concatenating the "partitioning" scan chain to the internal/active scan chain for each particular functional block allows easy input value set-up for any functional block. The observing of outputs resulting from the testing can be easily done since all outputs of each functional block are stored via one or more scan chain cells. In some cases, due to performance requirements, a redundant scan chain flip-flop is coupled in parallel to a functional flip-flop wherein the functional flip-flop runs in normal mode and the redundant scan chain flip-flop operates during scan testing. The output registers/cells used in the scan chains were from the limited class of cells known as Pregs or PCells.

Another problem with conducting scan tests on a device with disjoint partitions is that of three-state (or tri-state) busses. Some three-state buses in an IC design are driven by partitioned blocks that are not actively under test. The three-state busses may be driven by multiple sources during the scan shift operation causing an indeterminate state on the bus due to bus contention during the shifting operations. Also, since the software tool that establishes the internal logic values is limited to operating on a single partitioning block, the tool does not have access to the sources of a global three-state bus which are in other partitioning blocks. Therefore, the tool cannot guarantee operation which will prevent tri-state bus contention during the scan sample cycle. Three-state busses driven from multiple sources can be destructive and can cause a loss of test controllability and observability, ultimately resulting in a loss of fault coverage. This problem was solved in the method/apparatus taught herein by requiring all three-state drivers to be selected from a class of logic elements known as the "Sbufio". The Sbufio is a three-state driver that has a functional drive enable signal and also has a "test disable" input that forces the driver to high-impedance both during the scan shift operation and whenever the partitioned block is not actively the one block selected for test.

The problem of providing test support to detect and isolate alternate fault classes such as AC Path delay and AC Gate Transition Delay, is also made more complicated when operating on disjoint partitions and supporting an overall design that has a single globally distributed clock signal with no gating elements to prevent sequential operation of blocks not actively under test. These fault classes require that the scan test architecture operate at or above the rated frequency for both the scan shift and the scan sample operation and that single-cycle and two-consecutive-cycle scan sample operations can be conducted. The main problem here is that the input signals provided to the block under test from disjoint partition blocks not actively under test are indeterminate using prior art partitioning methods. The collection of all of the output signals from these blocks into a single partitioning scan chain that is concatenated to the end of the internal scan chain under test (as taught herein) solves part of the problem by allowing the signal value to be applied to be shifted in. This solution still leaves the problem of the two-consecutive-cycle scan sample operation for path delay tests, since the first scan sample would read indeterminate values into the partitioning scan chain from the blocks not under test which would then apply indeterminate signal values to the block actively under test before the second sample cycle. This problem was also solved herein by restricting the partitioning scan chain to the Pcells and Pregs scannable elements. These cells were also designed in such a way as to hold their state through two scan sample cycles so that AC path delay tests could be conducted.

These solutions discussed above are different from the LSSD method used predominantly by IBM which relies on multiple clocks and has a much higher area/transistor count penalty. The method taught herein relies on a single clock and the only area penalty for most cells is the added scan shift/sample multiplexor per scannable cell.

In the method/apparatus taught herein, each functional block has an internal scan chain and the "partitioning" output scan chain serially connects all outputs of each block together to form an additional external scan chain. One functional block is tested at a time and therefore one functional block internal scan chain is used at a time. The scan chains which are in functional blocks that are not being tested receive all shifted zeros in a serial manner to provide for low power consumption during testing and to determine which functional unit may be over powered due to design errors or manufacturing errors. Therefore, the method taught herein may be used to isolate low power mode problems in an integrated circuit (IC). In addition, when the one functional block is tested in a normal mode of operation after receiving scan data, the scan chains which are not actively being used for testing are still placed in the shift-mode (not normal mode) and only receive continuously serially shifted logic 0's to maintain a minimum power consumption. For a CMOS process, a continuously serially shifted series of logic zeros effectively places all non-tested gates and storage elements in a low-power mode where they do not contribute to the power consumption or current draw of the testing since no switching is occurring. This serial shifting of all zeros also reduces the noise floor for the active tests. The net result is that IDDQ type of current testing can be supported since all current leakage should be isolated to within the functional block under test.

The above test architecture or method would be set-up by an external test device, a semiconductor tester, a general tester, or a specifically constructed test jig, in the following manner: (1) the external package signals that are used to place the IC device in scan mode are set to the proper logic value; (2) the external package signals that select the scan chain within a disjoint partitioned logic block are set to the proper logic value to select one target scan chain among many internal functional block scan chains; (3) the selection from item 2 above connects a SDI (scan data input) package pin to the beginning of the selected internal scan chain via a demultiplexer (10 in FIG. 1) and connects the partitioning scan chain of block output values to the end of the selected scan chain through a re-mapping multiplexor (MUX 24 in FIG. 1); (4) the P-cells of non-selected blocks go into a sample hold mode (to shift in zeros for low power) while the P-cells of the block under test allow the input of serial scan test data.

Once the proper scan system is connected or set-up as discussed above, the tester applies a long serial data vector to the single scan input pin which is accepted by the flip-flops of the selected functional block to be tested in a serial manner while zeros are simultaneously applied to all scan chains in all non-selected functional blocks. While the serial scan vector is being shifted in, the existing state of the scan shift register would be shifted out one bit at a time synchronous to each rising edge of the clock on the single scan output pin, SDO (see FIG. 1 ). After the last bit is shifted in, the single scan shift enable pin, S_SE in FIG. 1, is transitioned to a logic 0 from a logic one which allows all of the sequential elements within the block under test to sample from their D-input signals synchronous to the next rising edge of the clock (i.e. in other words, when S_SE is transitioned, the scan mode is exited and the normal parallel mode of operation is entered for testing by using the input scan values). While the shifting and sampling is occurring in the block under test, all other sequential logic in the IC device is constantly shifting logic 0's to minimize the power consumed by logic not under test and to minimize the noise level of the chip caused by device switching.

To summarize the description above, the present invention can implement a complete FULL-SCAN TEST ARCHITECTURE that can operate on a disjoint partitioned logic block within a device by using only a single clock, a single scan test port, and by making use of the multiplexed flip-flop based scan methodology. By using this technique, individually partitioned functional blocks can be tested for structural stuck-at faults, AC delay faults, and IDDQ based faults.

The nearest known method/structure to the method/apparatus taught herein is the IBM LSSD methodology which detects stuck-at and transition delay types of faults, but does not conduct real path delay tests at the speed of the processor. This prior art LSSD method uses much more silicon substrate area and cost than the method disclosed herein since each combination of latches forming a complete sequential device requires an extra/additional scan test latch and the latches require the routing of 3 clocks as opposed to the one clock taught herein. As device geometries reduce in size, the routing penalty of multiple clock signals and connections from the functional latches to the scan latches become more problematic. The prior art method performs conducting delay tests by manipulating the clock period which does not exercise true speed paths, but just gate delays, and does not operate the device in a true operational fashion like the methodology and structure taught herein. The LSSD prior art method uses many scan input ports which may affect the timing performance of the external package pins, increase package pins/cost, and require vector generation on the whole device at once, which may be beyond the scope of some software tools (especially since integration levels are exceeding 2 and 3 million transistors). The LSSD method uses the parallel functional memory of the tester which is usually limited (as opposed to deep scan memory) and may require multiple loads to fully conduct testing to an adequate quality level.

Another prior art method is Multi-Chip-Module (MCM) Scan Testing in which each block is surrounded with an IEEE 1149.1 (JTAG) scan chain. This method also carries a much higher logic cost than the method taught herein. Also, the IEEE 1149.1 boundary scan operation is controlled by a standardized known state machine which does not allow at-speed shifting with a sample or capture operation on the first cycle after shifting or with two-consecutive-scan-sample cycles after shifting (which are both necessary for AC delay tests).

The present invention overcomes many of the disadvantages of the known prior art FULL-SCAN TEST ARCHITECTURE that are stated above and can be more fully understood with reference to the FIGS. 1–14.

FIG. 1 illustrates a FULL-SCAN TEST ARCHITECTURE which is designed into a data processor or a like IC that contains a plurality of functional blocks 12–22. In FIG. 1, an operand pre-fetch unit (OPU) 12, an operand cache unit (OCU) 14, an instruction pre-fetch unit (IPU) 16, a instruction cache unit (ICU) 18, a bus interface unit (BIU) 20, and a floating point unit (FPU) 22 are illustrated as functional units. It should be apparent that any number of functional units from one to hundreds can exist in a microprocessor or IC. These functional units may be more or less than the functional units illustrated by example in FIG. 1. The architecture of FIG. 1 comprises the scan test port (a plurality of scan inputs and outputs illustrated to the left of FIG. 1), the scan test controller 10, the physical wire connections between the test controller 10 and the functional blocks 12–22, the individual internal scan chain per functional block, the physical wire connections from the functional blocks 12–22 to the scan remapping multiplexor 24, and the partitioning scan chain (a vertically illustrated scan chain coupled between the MUX 24 and the SDO pin which passes through all the functional blocks 12–22.

The scan test port itself is comprised of the following pins/terminals: the single input control signal "scan sample enable" (S_SE); the single data input signal "scan test data in" (STDI); the single clock input signal (PCLK); the plural-conductor input bus "test address" (TSTADDR); the plural-conductor input bus "test mode" (MTM); and the single data output signal "scan test data out" (STDO).

All the scan test port input signals, except for the clock input PCLK, all enter the IC through the test controller 10. The primary function of the test controller 10 is to map these external package signals to their internal purpose and control data input demultiplexing. The "scan sample enable" (S_SE) is a control signal which is used to place the internal scannable sequential elements in the functional units 12–22 in one of either the scan-shift mode or functional-sample mode (normal mode). The "scan test data in" (STDI) is the serial input which is used to apply the serial scan vector data to the internal scan shift register selected for test. The "test address" (TSTADDR) is a control signal that selects one of the six internal scan chains (one scan chain is within each functional block 12–22) for testing; the "test mode" (MTM) is a control signal that indicates that the data processor is either in functional operational mode (normal mode), or in scan test mode or like mode. The "clock" (PCLK) input signal is the functional system clock used to synchronize the updating of all sequential elements contained within the device regardless of whether the device is in scan mode or functional mode (normal mode).

The test controller 10 will activate one of the plurality of scan chains by coupling one of the scan chains in the functional blocks 12–22 to the input STDI through the test controller 10. In addition, the one selected scan chain is coupled through the MUX 24 to the output scan chain which lies between the output of MUX 24 and the SDO pin (Note: the output scan chain couples in a serial manner at least one flip-flop in each functional unit 12–22 in series wherein the at least one flip-flop in each functional blacks are outputs of the respective functional block). The particular block to be tested is selected by the logic value placed on the TSTADDR signals. The set-up for the input of scan data begins by connecting the STDI input signal to the first scannable element of the functional block selected by the value placed on the TSTADDR when the MTM signal is set to scan mode. For example, a value of 011 binary on MTM will place the data processor 30 into scan test mode, and the value of 0000 on TSTADDR will select the functional block labeled OPU (operand pipeline unit) 12 by connecting STDI to the wire that goes to the first scannable sequential element within the OPU block. All other scan chains besides the selected scan chain in the OPU (for this example) will receive a constant logic 0 which effectively places them in a low power state since CMOS transistors only consume power (i.e., surge current) when changing state.

Within each of the functional blocks 12–22 there are two separate serial shift registers (scan chains). One scan chain is comprised of all of the sequential elements within the block and is known as the block "internal" scan chain. The other scan chain is comprised of all of the sequential elements at the output boundary of the block and in special areas such as the output boundary of embedded memory arrays and on three-state busses. This other scan chain is the scan chain coupled between MUX 24 and the SDTO through all of the functional blocks 12–22. This other scan chain is known as the block "partitioning" scan chain. All functional blocks are made scannable when the value on MTM places the device in scan test mode (all of the internal sequential elements are connected together as a serial shift registers when the S_SE signal is asserted).

The last sequential element in the internal serial shift register of the functional block selected by TSTADDR drives the wire connection that connects to the dynamic scan chain remapping multiplexor 24. The dynamic scan chain remapping multiplexor 24 connects the scan chain under test (from one of the functional blocks) to the first sequential element in the partitioning scan chain since the multiplexor is also controlled by TSTADDR (for example if the logic value on TSTADDR is 0000 then it will pass the data from the last sequential element in the scan chain exiting the OPU 12 functional block to the first sequential element of the partitioning scan chain through the remapping multiplexor 24). In addition to the partitioning scan chain serially coupling all of the individual block partitioning scan chains, the partitioning scan chain is serially coupled to a scan chain which overrides the normal input pins. The partitioning scan chain is of a fixed length and becomes the end section of any selected internal scan chain by concatenation through the dynamic scan chain remapping multiplexor 24. The last sequential element in the partitioning scan chain drives the serial scan data out (STDO) pin. In FIG. 1, the functional normal mode logic of functional blocks 12–22 are massively interconnected so that each block, for example block 12, may be receives inputs from one, several, or all of the remaining blocks, for example blocks 14–22.

Figure 2:
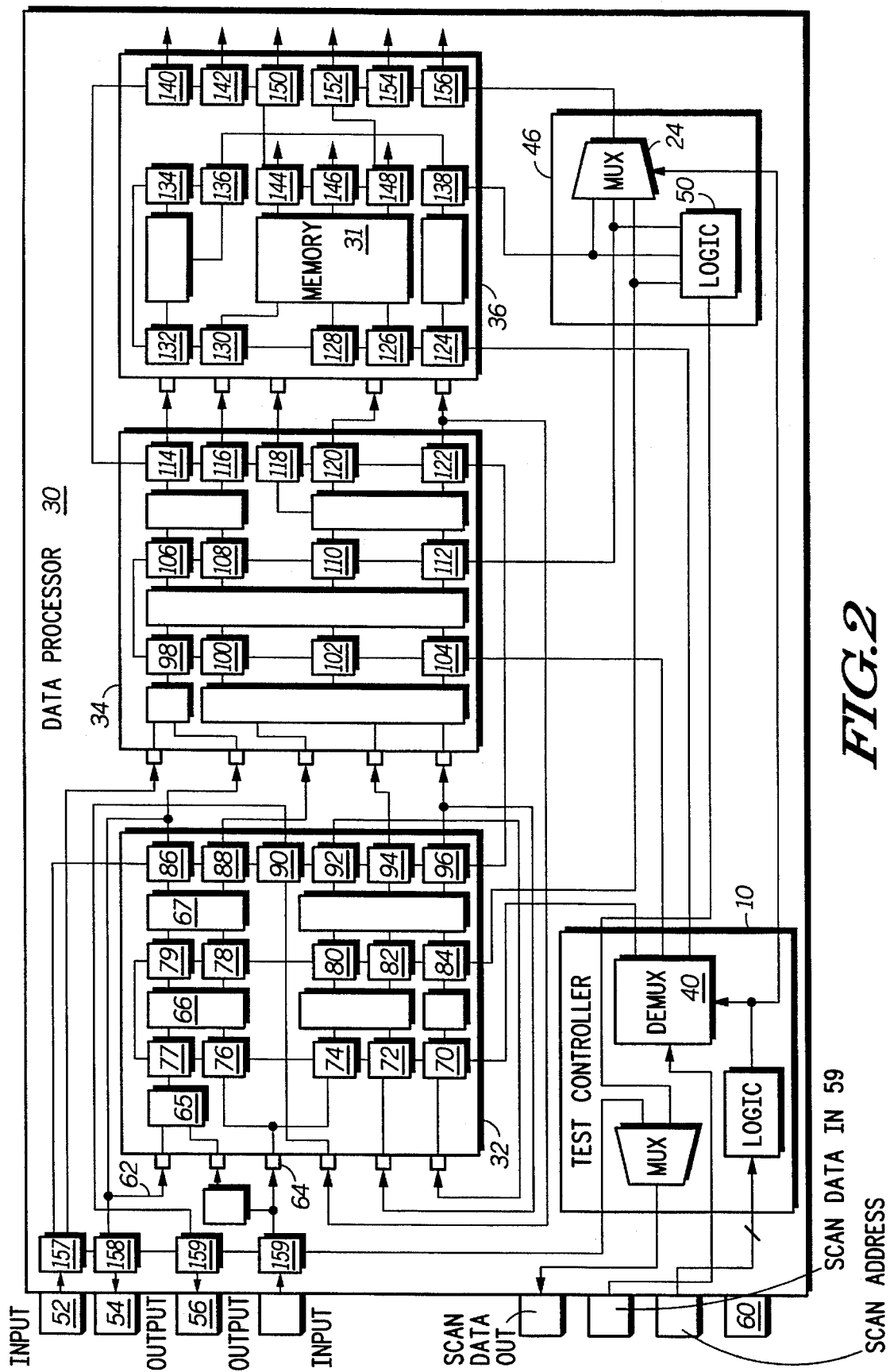
FIG. 2 illustrates, in a block diagram, the a data processor having a serial scan chain architecture in accordance with the present invention.

FIG. 2 illustrates the scan test architecture of FIG. 1 in more detail by showing examples of only three (not six as in FIG. 1) of the plurality of functional blocks 12–22. These three functional blocks of FIG. 2 are illustrated as blocks 32, 34, and 36 and are contained within a data processor 30. FIG. 2 illustrates the individual block internal scan chains (three respective scan chains labeled respectively as 70–84, 98–112, 124–138 which are coupled in parallel between DEMUX 40 and MUX 24 in FIG. 2), the block partitioning scan chains (86–96, 114–122, 140–156, and 157–159 which are serially coupled to form one large partitioning scan chain), the block input and output signals, and examples of the combinational logic tested by the scan architecture (illustrated by boxes which may or may not be labeled). For ease of description, all disjoint partition block input pins will be shown on the left side of the block and all disjoint partition block output pins will be shown on the right side although this will clearly not usually be the physical reality in an IC. Also illustrated in FIG. 2 is the test controller 10 separated into two parts where controller 10 is the circuit portion containing the interface to the scan package pins and logic block 46 is the circuit portion which contains and controls the dynamic remapping multiplexor 24 and has some additional circuitry for diagnostics.

FIG. 2 illustrates how the scan chain of FIG. 1 can be used to test logic contained within the disjoint blocks/partitions 32, 34, and 36. The classes of testable logic within processor 30 are: logic within a partition/block but between the partition block input pins and the internal scan chain illustrated by logic 65; logic completely surrounded by the partition block internal scan chain as illustrated by logic 66; logic between the internal block scan chain and the partition block outputs which is the block partition scan chain illustrated by logic 67; and memory type logic illustrated by memory 31 which may be a cache, register, or the like.

The logic value applied to the TSTADDR pins when the MTM logic value is set to scan mode, will cause the demultiplexor 40 to connect the scan data in pin 59 to be connected to the first scannable sequential element of the selected partition block. For example, one encoding would connect STDI 59 to the internal scan chain element 70 in block 32, while another encoding would connect the STDI pin 59 to internal scan chain element 104 in block 34, and yet another encoding would connect STDI 59 to internal scan chain element 124 in block 36. Simultaneously to the connection of STDI 59 to the beginning an internal scan chain through the demultiplexor 40, the partitioning scan chain, which is made from the scannable output registers of all blocks and the package pin registers (86–96, 114–122, 140–156, 157–159), is connected to the end of the selected scan chain through the dynamic remapping multiplexor 24. For example, the TSTADDR encoding that would connect STDI 59 to the internal scan chain element 70 in block 32 would connect the partitioning scan chain to element 84 in block 32 through the remapping multiplexor 24, the encoding that would connect STDI 59 to scannable element 104 in block 34 would connect scannable element 112 in block 34, and the encoding that would connect STDI 59 to scannable element 124 in block 36 would connect scannable element 138 in block 36 to the partitioning scan chain and so on for other scan chains which are implemented.

The encodings of TSTADDR that result in a scan test architecture, will connect the partitioning scan chain to the serial test data out pin, STDO 58, through yet another multiplexor in the test controller 10 labeled MUX. Certain encodings of TSTADDR will allow diagnostic testing to occur and will directly connect all of the last scannable elements of the internal scan chain (84, 112, 138) to the STDO 58 pin through a data compression circuit 50.

When a TSTADDR encoding is chosen that makes a complete scan chain architecture for testing of partition block logic, then the various classes of logic introduced previously (65, 66, 67, 31) or entire functional blocks can be tested by the scan chain architecture. The serial scan vector, which is a set of logic values 1 and 0, is applied to the STDI pin 59, and is shifted in one bit at a time on the rising edge of clock as long as the scan shift enable, S_SE 60, is asserted. It should be noted that falling edge shifting may also occur in other embodiments. The length of the serial scan vector in bits is exactly the number of scannable sequential elements contained between the STDI 59 and the STDO 58 pins which may be different depending upon the functional block selected for testing. When the vector has been installed through the STDI pin, the STDO pin provides as serial output any information previously contained in the flip-flops/storage elements in the scan chains of FIG. 2. This information may be previous results from an earlier test or may be unimportant and therefore discarded information depending upon circumstances.

An example using FIG. 2 is now provided. Assume that the Address input selects functional block 32 for testing and that the processor 30 is placed into scan mode. The demux 40 is selected to couple SDI to flip-flop 70 which couples scan chain 70–84 to the SDI input. The multiplexer 24 is set to couple the flip-flop 84 at the end of the selected scan chain within block 32 to the partitioning scan chain of flip-flops 156–140, 122–114, 96–86, and the I/O/input/output flip-flops 157–159. These concatenated scan chains are connected to the SDO pin through a MUX in the test controller 10. A scan input vector is sequentially provided in a serial manner to the SDI pin and the PCLK is enabled. The SDI data is serially transferred to the flip-flops in the newly concatenated scan chain to set up both internal states of the block 32 and all the outputs of all of the functional blocks in FIG. 2. All the outputs of all of the functional blocks are set-up via the partitioning scan chain concatenated to the end of the functional block scan chain within block 32 (the partitioning scan chain in the serial SDI path ensures that all inputs to the block 32 are pre-set, known, and controlled).

Figure 13:
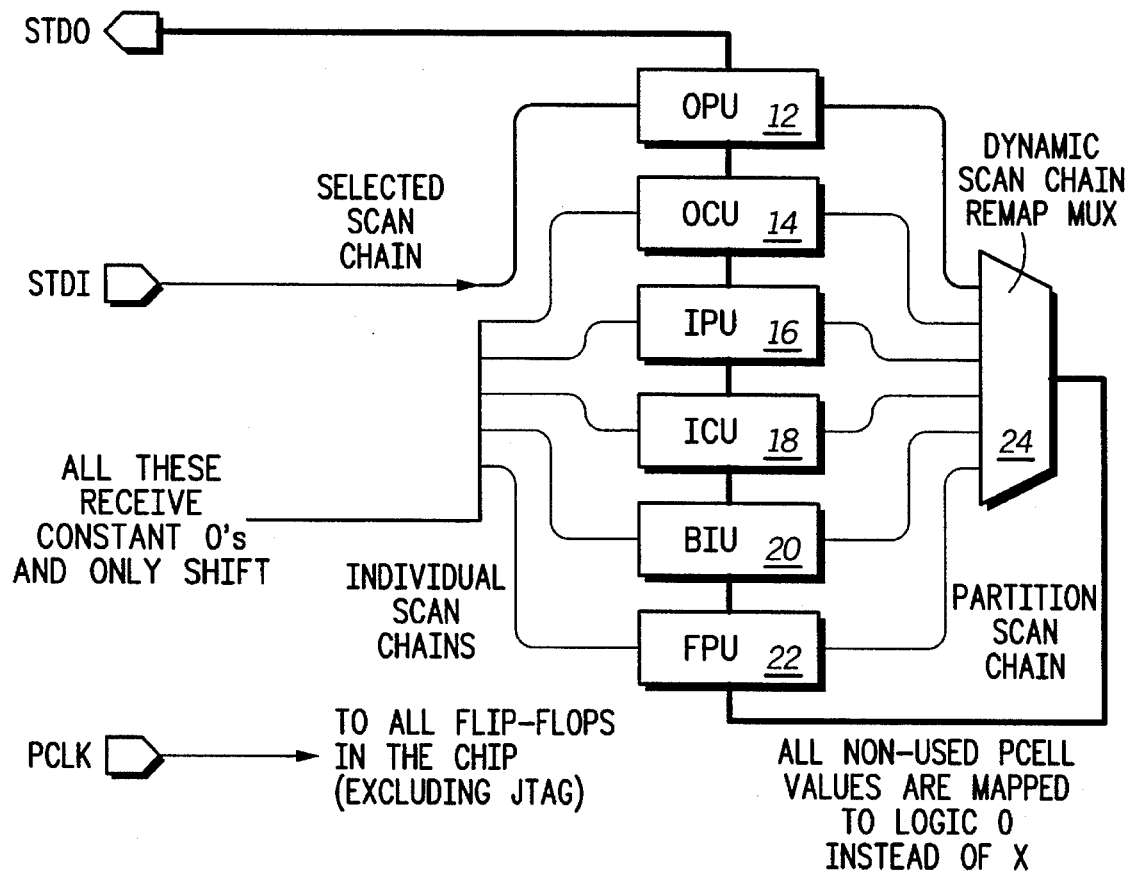
FIG. 13 illustrates, in a block diagram, the low power mode operation of the circuit of FIG. 1.

Once the scan vector is loaded into the in the newly concatenated scan chain, every register in the scan chain contains a pre-determined logic value, 1 or 0. For this example, the values would be established for the internal scan chain comprised of elements 70–84 and the partitioning scan chain comprised of elements 156–140, 114–122, 96–86, and 157–159. However, the internal scan chains of blocks 34 and 36 comprised of elements 98–112 and 124–138, respectively will not receive STDI data but will instead receive all logic 0's sourced from the demultiplexor 40 so that they consume no power (this is shown in FIG. 13). The scan chain, now containing pre-determined logic values establishes a state condition that is used to test the classes of logic 65, 66, and 67. Since these classes of logic should contain only combinational logic (but are not restricted to only combinational logic), then the values applied should completely resolve within one clock cycle. Prior the rising-edge of the PCLK that signifies the beginning of the next clock cycle after the last value has been serially shifted in from the STDI pin, the S_SE pin will be deasserted which places the internal scan chain 70–84 and the partitioning scan chain of block 32 into the mode by which the rising edge will allow these sequential elements to sample the functional circuit response from logic classes 65, 66, and 67 from the functional or D input of the scan element. This response is then shifted out though the STDO pin when the next scan vector is shifted in.

Figure 4:
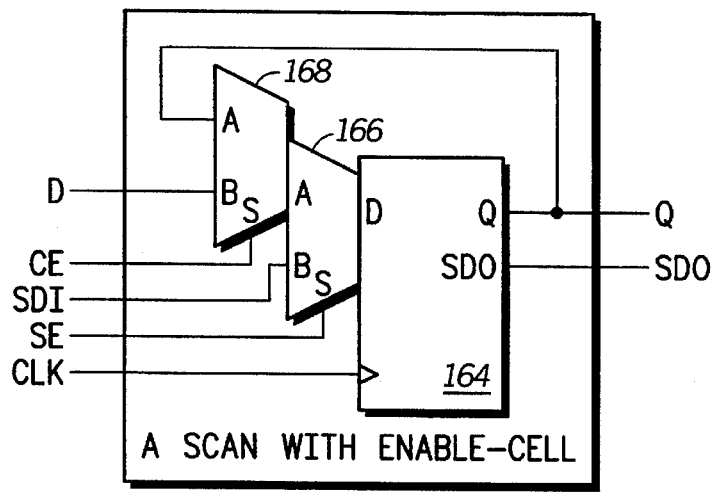
Figure 5:
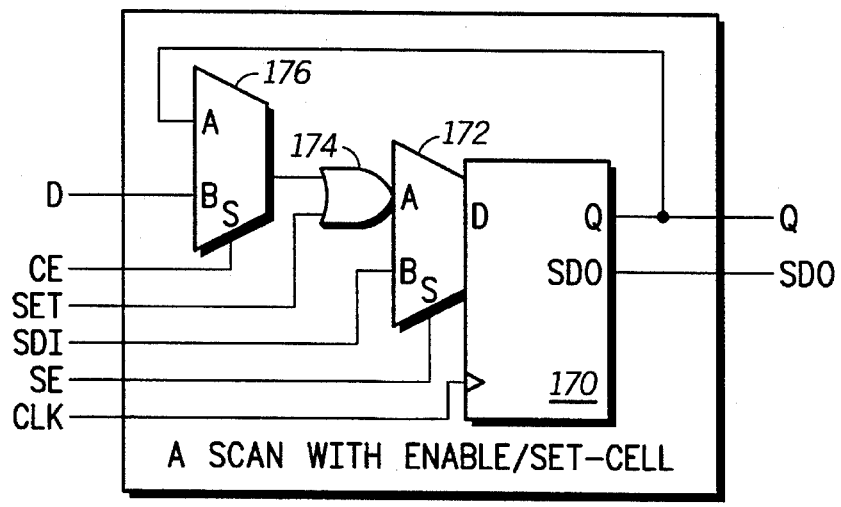
Figure 6:
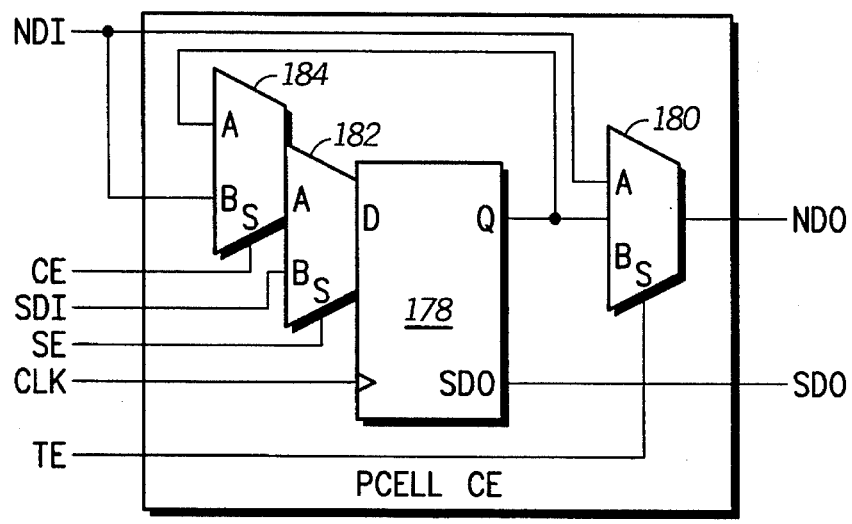

In order to implement the scan chain of FIGS. 1–2, several new scan chain storage elements or partitioning cells where created and are illustrated in FIGS. 3–11. In FIGS. 3–11, control signals are as follows: D=data input; Q=data output; NDI=normal data input; NDO=normal data output; CE=clock enable; SE=scan shift enable; SDI=scan data in; SDO=scan data out; CLK=clock; TE=transmission enable; TD=tri-state disable or enable; A=any logic signal; EN=enable; ZI=output of tri-state; and XPCE=additional chip enable. These new scan chain storage elements or partitioning cells were used in place of other storage elements such as simple D flip-flops to enable scan functions without hindering normal mode performance. Testable logic of class 65, test logic that is between the inputs of functional block 32, and the internal scan chain 70–84, are verified values since the values applied to the inputs of the tested functional block come from the partitioning scan chain which are the outputs registers (for example, elements 86–96) of other blocks or the override registers of the pad ring (see elements 157–159 in FIG. 2). These inputs to a functional block would be applied from sequential devices known as partitioning cells, such as the PCELL and PREG shown in FIGS. 6 and 7 for standard block outputs, the BBCELL shown in FIG. 8 for outputs from memory (elements 144–148) or other indeterminate logic, and the TCELL shown FIG. 9 for bi-directional or tri-state busses. To ensure that there is no contention on tri-state busses, the Sbufio shown in FIG. 10 will disable all bus drivers except for the driver shown in FIG. 9 and any driver contained within block 32 (for this example). The PCELL or PCELL_CE (partitioning cell or partitioning cell with clock enable) shown in FIG. 6 is an example of scannable element used to override a combinational output signal sourcing from a block not under test. When not in scan test mode, the functional mode signal enters on the signal named NDI and exits on the signal named NDO while the signal TE is deasserted. During scan test mode, the signal TE is asserted and the signal NDO receives its data from the scannable element 178.

Figure 7:
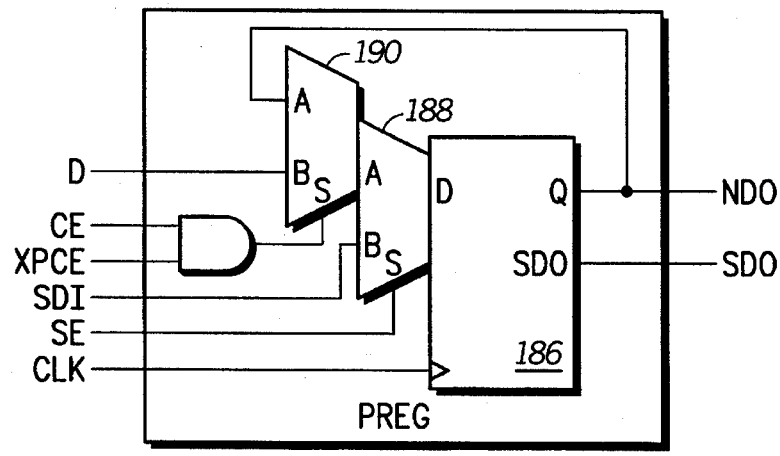
Figure 8:
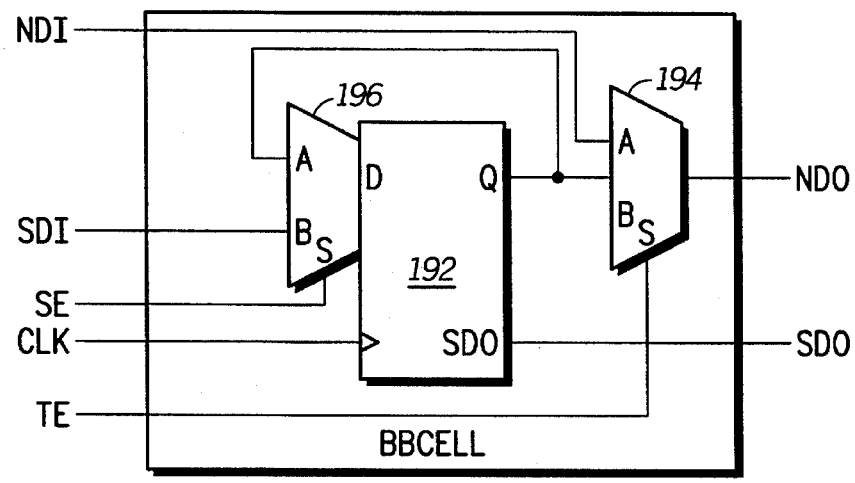
Figure 9:
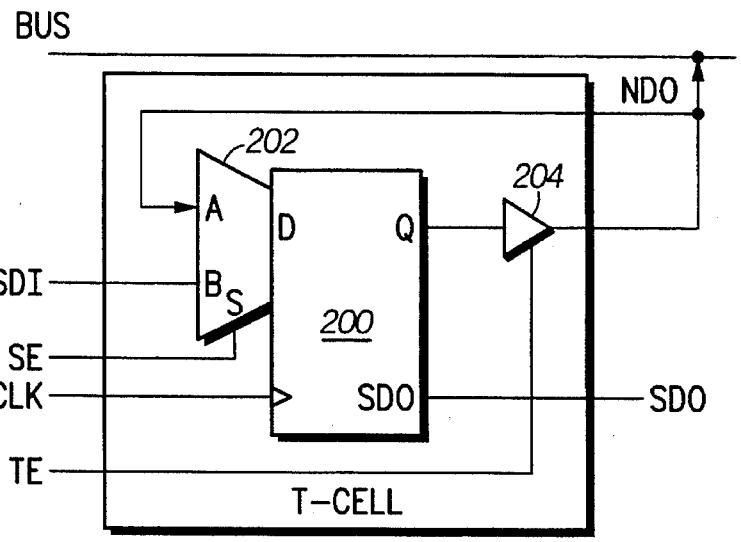
Figure 10:
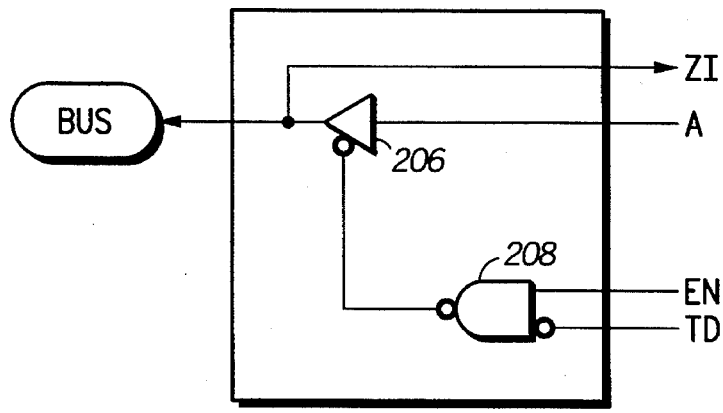
Figure 11:
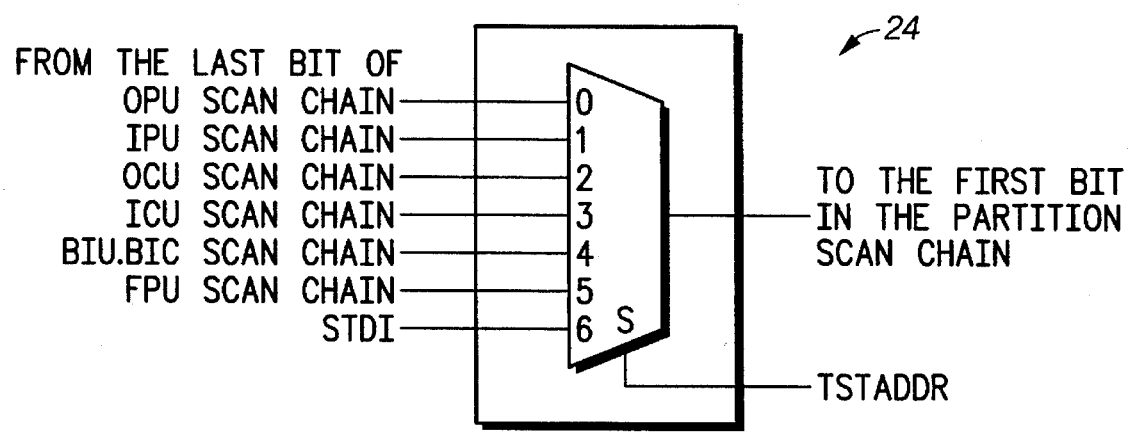
FIG. 11 illustrates, in a circuit diagram, the MUX 24 of FIG. 1.
Figure 12:
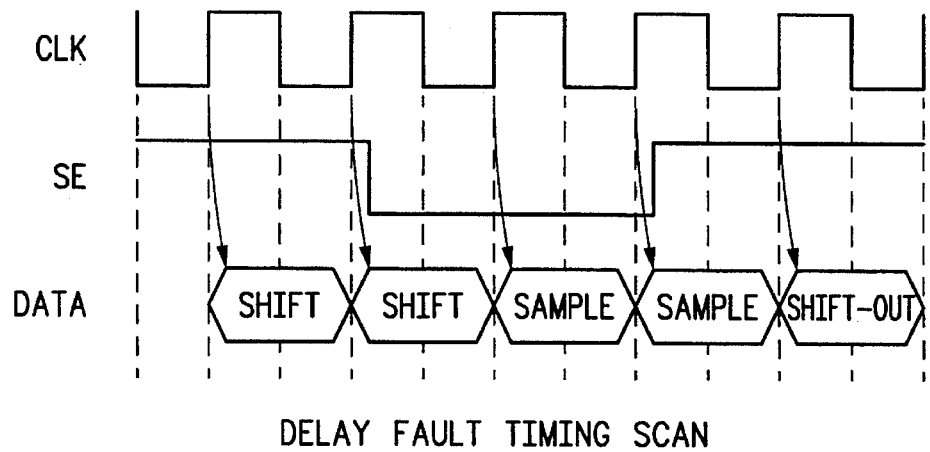
FIG. 12 illustrates, in a timing diagram, the scan and test operation of the system of FIGS. 1–2 for speed path testing.

The PREG (partitioning register) shown in FIG. 7 shows an example of a scannable element that would replace an existing output register. The signal NDO is the functional output signal from the sequential element 186. During functional mode this element would receive data from the pin labeled D since the signals XPCE and SE would be deasserted. During scan test mode this device would get its values from the serial scan chain on the SDI pin since the signal named SE would be asserted. The BBCELL (black boxing cell) shown in FIG. 8 is an example of a scannable element used to isolate a section of logic (such as the memory array 31 shown in block 36) that may inject indeterminate values into the logic under test. This element operates similar to the PCELL of FIG. 6 except that the scannable device 192 output shown on the pin labeled Q is fed back to the pin labeled D so that during scan mode this device will never sample the circuit value but will always hold its state (this is necessary if a Built-in-Self-Test based on signature analysis or other data compression is done based on the values that are captured by the scan chains).

Figure 3:
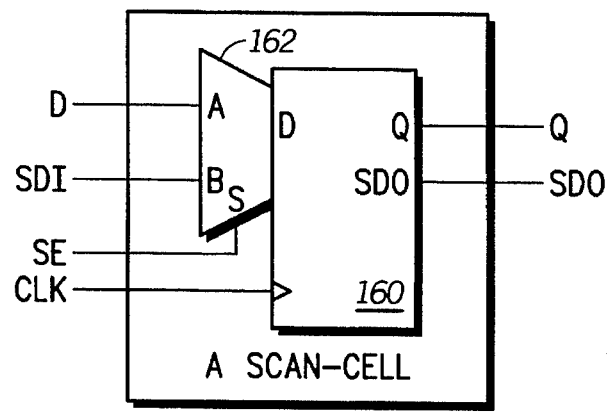
FIGS. 3–10 illustrate, in circuit diagrams, serial scan chain storage cells which are used to form the scan chains illustrated in FIGS. 1–2.

The logic values applied to the input pins of block 32 will flow through the logic to be tested 65 and will be captured during the sample cycle in scan sequential elements, such as those shown in FIGS. 3, 4, and 5. These elements are part of the restricted general sequential device set used for all sequential logic within the data processor. The sample or capture cycle (normal mode) will be done on through the element pins labeled D when the scan shift enable pin SE is deasserted. All the sequential devices shown in FIGS. 3–9 will shift unconditionally when the pin labeled SE is asserted since the scan multiplexor 162, 166, 172, 182, 188, 196, and 202 has the highest priority over all other functions committed by these elements. For example the cell in FIG. 5 has its functionality shown in block diagram form and is a D-type Flip-Flop 170 with a scan multiplexor 172 to select whether data is latched from the functional input D or the scan input SDI, a logical OR gate to allow the set function, and a data enable multiplexor 176 to allow the hold function by selecting from the present state of the flip-flop 170 or the D input pin. It must be stated that FIGS. 3, 4, and 5 illustrate examples of some of the scan cells and their general functional construction as block diagrams, other cells with functionality of clear, clear and set, and inverted data outputs also may be used herein as scan cells.

The logic of class 66, which is logic that is completely surrounded by the internal scan chain, will be verified by the values held in the internal scan chain and will not require any values be applied from the partitioning scan elements (which are outputs of other functional blocks, input storage elements 157–159, and memory storage elements 144–148).

Logic of class 67, logic between the internal scan chain (or the block input pins) and the output pins of the block (which is the partitioning scan chain), is verified by the application of logic values from the internal scan chain or partitioning cells from other blocks after the shift operation is completed. These values flow through the logic to be tested and will result in logic values being applied to the D input pins of the partitioning scan chain (elements 86–96) within block 32. This scan chain is made of scannable elements such as those shown in FIGS. 6–9 (which have already been described). The S_SE signal is deasserted after the rising-edge of the clock that corresponds to the last shifting operation, and the next rising-edge will result in the capture or sample of the functional circuit values that are present on the D pins of scannable elements represented by FIGS. 6, 7, and 9 (FIG. 8 cannot sample circuit values).

This type of single sample cycle test is used to determine circuit correctness for the single stuck-at fault model (the assumption that a physical fault will present itself as a net, node, gate or device that is tied to a logic 1 or a logic 0 DC value). The above type of testing may occur by shifting in the scan vector and conducting the sample at any clock rate (frequency) at or below the rated frequency of the device. This embodiment allows for shifting and sampling to be done in a range from below the rated frequency of the device to at or above the rated frequency of the device. Conducting the shift and sample operation at or above the rated frequency allows for the transition or gate delay fault model to also be supported (the assumption that a physical fault may also present itself as an AC effect by associating a logic value rise or fall time limitation on nets, nodes, gates, or devices).

When the scan vector is applied to the STDI pin at a frequency at or above the rated device frequency and two sample cycles are conducted after the shift operation (as shown in the timing diagram of FIG. 12), then the path delay fault model can be used. This fault model is similar to the gate delay fault model but with the difference in that the two sample cycles allow for the determination of delay stack up across an entire path. This form of testing is used to determine if specific critical paths in the device are meeting their rated propagation time. This determines if the device itself meets its frequency rating (i.e., a data processor sold as a 33 MHz device must show functional operation of all true internal paths at 33 MHz).

Figure 14:
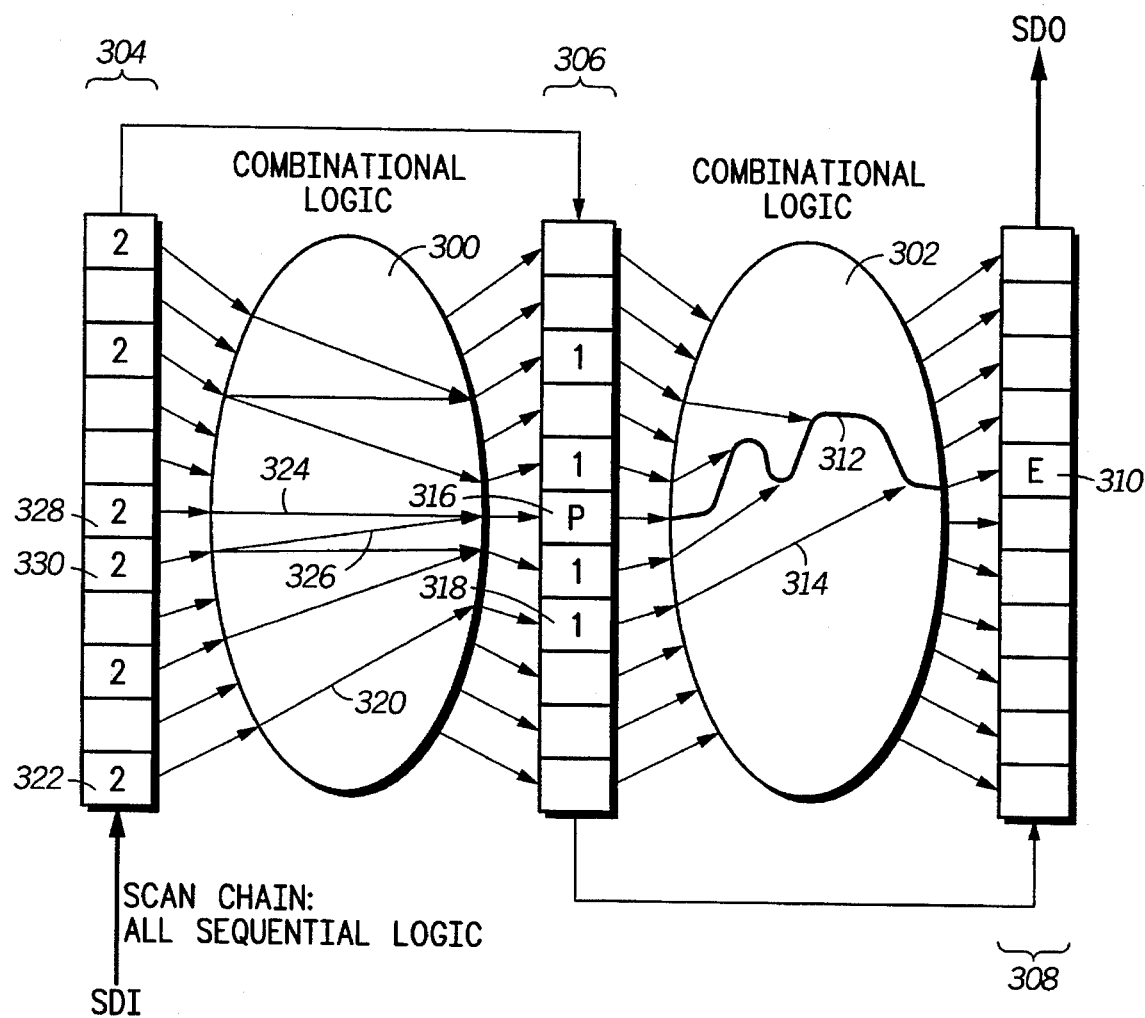
FIG. 14 illustrates, in a block diagram form, a circuit which is speed path tested using the method and apparatus from FIGS. 1–13.

FIG. 14 shows this process in detail. A single concatenated scan chain (such as the present example of testing block 32) consists of all scan elements connected from the STDI pin to the STDO pin. A subset of this architecture is shown here connected between SDI and SDO. The path 312 comprised of nets, nodes, gates, transistors, and other logic devices is a path within a grouping of logic 302 and has been identified as a critical path which must meet the condition that the sampled response E in scannable element 310 arrive at one fixed clock edge from its launch from scannable element P (e.g., a logic 1 to logic 0 transition must occur at E within a time period of 20 nano-seconds, for a 50 MHz clock rating, after the proper launch value, for example a logic 0 to logic 1 transition at point P). In order for the transition that occurs at E to be directly a result of the change in value at P, the path itself must be conditioned to pass the transition. This is done by fixing the off-path values (e.g., the other inputs to an AND gate other than the one input directly in the path) by tracing back through the logic and placing the correct value in scannable elements (as shown by the logic value 1 cells in scan chain segment 306). It can be seen that in order for the transition to occur at E, a transition must occur at P and all of the path establishing values must also occur, but in the previous clock cycle domain to the expected transition. In order to achieve the transition at P, logic one clock cycle domain earlier than this must be established (noted as 2 for 2nd clock domain in scan chain segment 304). This is why two sample cycles occur (see FIG. 12). An initial vector is scan shifted into the scan chain which establishes the logic values noted as 2 in scan chain segment 304 and also establishes the fixed values noted as 1 and P in scan chain segment 306. The applied values noted as the numeral 2 propagate through the logic grouping 300 and place pre-determined logic values on the D pins of the scannable elements marked as P and 1 in scan chain segment 306. The element 322 may be a logic value the propagates through a path 320 and applies a logic value to element 318 in scan chain section 306 that would cause it to hold its value the same. The logic values in scan elements 328 and 330 may propagate through paths noted as 324 and 326 to cause the value of P to transition. When the first sample cycle is done (i.e., a rising-edge of PCLK is done), the scannable elements noted as 1 in scan chain section 306 will update causing the values noted as 1 to remain the same while a transition occurs on P. The values that are now in scan chain section 306 will cause the off-path values of path 312 to remain the same while the transition that just occurred at P will propagate through to the D input of element 310. On the next rising edge of PCLK, the element 310 should capture the transition noted as E.

In the architecture shown in FIG. 2, some of these above described events could not occur if the Partitioning scan chain were not made of specific elements that can hold their value during two sample clock cycles. For example, while testing block 32 in which we suppose that logic groups 300 and 302 are contained within the logic classes 65, 66, and 67, the element 122 in block 34 would update with a non-pre-determined value after the first sample was done (since block 34 is not being analyzed by the Automatic-Test-Pattern Generation tool). The indeterminate value may be an element shown as 1 in scan chain section 306 which would invalidate the ability to hold the off-path signals stable. Since a specific subset of scan elements are used for the partitioning scan chain, this problem is solved and the scan element involved maintains its scanned in value during two sample cycles. This ability is a result of the CE signal that controls the feedback hold multiplexor 184 in FIG. 6, a result of the XPCE signal which controls the feedback hold multiplexor 190 in FIG. 7, a result of the fundamental nature of the BBCELL shown in FIG. 8 (whenever the element is sample mode and SE is deasserted, then feedback multiplexor 196 feeds-back the present state), and a result of the way the TCELL is constructed in FIG. 9 (whenever the element is sample mode and SE is deasserted, then feedback multiplexor 202 applies whatever value is on the bus resulting in a hold operation of whatever is logic value is present on the bus).

FIG. 13 illustrates the low-power mode of operation of the scan testing taught herein. If one functional block (assume this block is block 12 in FIG. 13) is selected for testing, then block 12 gets coupled to SDI (scan data in) and gets coupled through the MUX 24 to the partitioning scan chain illustrated as the vertical line through all blocks 12–22. The partitioning scan chain and the scan chain of block 12 are coupled serially to the STDO (scan test data out) pin for after-test observation. All block not being tested are set in scan mode and are receiving constantly shifted logic zeros through the blocks to reduce power consumption.

While the present invention has been shown and described with reference to specific embodiments, further modifications and improvements will occur to those skilled in the art. For example, many types of scan cells exist in the art. Many scan architectures and methodologies exist in the art and may be incorporated with the above methods and apparatus. It is to be understood, therefore, that this invention is not limited to the particular forms shown and that it is intended in the appended claims to cover all modifications that do not depart from the spirit and scope of this invention.

What is claimed is:

1. A data processor having a scan chain architecture, the scan chain architecture comprising:

a plurality of scan chains wherein each scan chain in the plurality of scan chains has a plurality of serially connected storage elements, each scan chain having a first storage element which has a scan input and a last storage element which has a scan output;

a multiplexer having a plurality of inputs wherein each input in the plurality of inputs is coupled to one scan output from the plurality of scan chains, the multiplexer having a multiplexer output wherein the multiplexer output is selectively coupled to one of the inputs in the plurality of inputs via the multiplexer;

a demultiplexer having a plurality of outputs wherein each output in the plurality of outputs is coupled to one scan input from the plurality of scan chains, the demultiplexer having a demultiplexer input wherein the demultiplexer input is selectively coupled to one output in the plurality of outputs via the demultiplexer; and an output scan chain having an input coupled to the output of the multiplexer and an output coupled to an output terminal of the data processor, the multiplexer serially coupling the output scan chain to a selected one of the plurality of scan chains to form a total scan chain comprising the selected one of the plurality of scan chains and the output scan chain.

2. The data processor of claim 1 wherein one of the scan chains in the plurality of scan chains is used to serially scan binary data for a circuit module selected from a group consisting of: an operand cache unit, and instruction cache unit, a bus interface unit, an integer processing unit, and a floating point unit.

3. The data processor of claim 1 wherein the demultiplexer is part of a test controller which receives a plurality of test address signals wherein the plurality of test address signals selects one scan chain in the plurality of scan chains to receive a serial bit stream via a serial data input coupled to the demultiplexer input.

4. A data processor comprising:

a plurality of circuit modules;

a plurality of internal storage elements in each circuit module, the plurality of internal storage elements in each circuit module being connected in a serial manner to form an internal scan chain in each circuit module, each internal scan chain having an input and an output wherein the input of each internal scan chain is coupled to a test controller and the output of each internal scan chain is coupled to a multiplexer; and a plurality of output storage elements in each circuit module, the plurality of output storage elements in each circuit module being different from the plurality of internal storage elements in each circuit module, the plurality of output storage elements in each circuit module being connected in a serial manner to form an output scan chain which is continuous through each circuit module, the output scan chain in each circuit module having an input and an output wherein the inputs and outputs of each of the output scan chains are coupled so that all the output scan chains in the circuit modules are coupled in a serial manner wherein the multiplexer selectively couples one internal scan chain and at least one output scan chain together in a serial manner to a scan data output terminal.

5. The data processor of claim 4 wherein the output scan chain comprises both output storage elements from the circuit modules and storage elements which are coupled to input and output terminals of the data processor.

6. The data processor of claim 4 wherein the test controller has a demultiplexer which is used to direct a serial bit stream from a serial input to one internal scan chain in the data processor.

7. The data processor of claim 6 wherein other internal scan chains which are different from the one internal scan chain in the data processor receive deasserted signals while the one internal scan chain in the data processor receives the serial bit stream, the deasserted signals being used in order to reduce power consumption in the data processor.

8. The data processor of claim 6 wherein other internal scan chains are kept in a serial shift mode to keep deasserted signals shifting through the other internal scan chains while the one internal scan chain in the data processor is functioning in a mode other than the serial shift mode.

9. The data processor of claim 4 wherein the test controller receives as input a serial data stream from an input terminal of an integrated circuit package which contains the data processor.

10. The data processor of claim 4 wherein the test controller receives as input a serial data stream from an the internal scan chains and routes the serial data stream to a terminal of an integrated circuit package which contains the data processor.

11. The data processor of claim 10 wherein the serial data stream is logically altered by a logic circuitry coupled to the multiplexer.

12. The data processor of claim 4 wherein the test controller receives as input an address which is used to select one internal scan chain among internal scan chains as a destination for a serial stream of input data.

13. The data processor of claim 4 wherein the output storage elements of a selected circuit module are time-sequential last storage elements in the circuit module which communicate signals external to the circuit module.

14. The data processor of claim 4 wherein the output storage elements of a selected circuit module are a set of last storage elements encountered within the selected circuit module before a signal exits the selected circuit module.

15. The data processor of claim 4 wherein a storage element in one of either the internal scan chains or the output scan chains comprises:

a local storage element having a clock input for receiving a clock signal, a data input, and a data output;

a first multiplexer having a first input coupled to receive a serial stream of data, a second input, a select input for receiving a select control signal, and an output coupled to the data input of the local storage element;

a second multiplexer having a first input coupled to the output of the local storage element, a second input coupled to a data input, a select input, and an output coupled to the first input of the first multiplexer; and a logic gate having a first input for receiving an enable signal, a second input for receiving a speed path control signal, and an output coupled to the select input of the second multiplexer.

16. The data processor of claim 4 wherein a storage element in one of either the internal scan chains or the output scan chains comprises:

a local storage element having a clock input for receiving a clock signal, a data input, and a data output; and a multiplexer having a first input coupled to receive a serial stream of data, a second input coupled to receive data signals, a select input for receiving a select control signal, and an output coupled to the data input of the local storage element.

17. The data processor of claim 4 wherein a storage element in one of either the internal scan chains or the output scan chains comprises:

a local storage element having a clock input for receiving a clock signal, a data input, and a data output;

a first multiplexer having a first input coupled to receive an enable signal, a second input, a select input for receiving a select control signal, and an output coupled to the data input of the local storage element; and a second multiplexer having a first input coupled to the data output of the local storage element, a second input coupled to a data input, a select input coupled to a serial data input, and an output coupled to the first input of the first multiplexer.

18. The data processor of claim 4 wherein a storage element in one of either the internal scan chains or the output scan chains comprises:

a local storage element having a clock input for receiving a clock signal, a data input, and a data output; and a logic gate for clearing a value stored in the local storage element.

19. The data processor of claim 4 wherein a storage element in one of either the internal scan chains or the output scan chains comprises:

a local storage element having a clock input for receiving a clock signal, a data input, and a data output;

a first multiplexer having a first input coupled to receive a serial stream of data, a second input, a select input for receiving a select control signal, and an output coupled to the data input of the local storage element;

a second multiplexer having a first input coupled to the output of the local storage element, a second input coupled to a data input, a select input coupled to a control signal, and an output coupled to provide output data; and a third multiplexer having a first input coupled to the data input, a second input coupled to the data output of the storage element, a select input for receiving an output control signal, and an output coupled to the second input of the first multiplexer.

20. The data processor of claim 4 wherein a storage element in one of either the internal scan chains or the output scan chains comprises:

a local storage element having a clock input for receiving a clock signal, a data input, and a data output;

a first multiplexer having a first input coupled to receive a serial stream of data, a second input coupled to the data output of the local storage element, a select input for receiving a select control signal, and an output coupled to the data input of the local storage element; and a second multiplexer having a first input coupled to a data input, a second input coupled to the output of the storage element, a select input for receiving an output control signal, and an output.

21. The data processor of claim 4 wherein a circuit module contains a memory wherein the memory has memory outputs, the memory outputs being coupled to memory storage elements wherein the memory storage elements are coupled in series and coupled within one output scan chain.

22. A data processor comprising:

a scan chain having a plurality of serially connected storage cells, each serially connected storage cell comprising:

a storage element having a clock input for receiving a clock signal, a data input, and a data output;

a first multiplexer having a first input coupled to receive a serial stream of data, a second input, a select input for receiving a select control signal, and an output coupled to the data input of the storage element;

a second multiplexer having a first input coupled to the output of the storage element, a second input coupled to a data input, a select input, and an output coupled to the first input of the first multiplexer; and a logic gate having a first input for receiving an enable signal, a second input for receiving a speed path control signal, and an output coupled to the select input of the second multiplexer.

23. A method for providing a serial data stream to a data processor, the method comprising the steps of:

providing an address to a test controller, the address coupling one serial scan chain from a plurality of scan chains internal to the data processor to an input terminal, each scan chain in the plurality of scan chains having a plurality of serially connected storage elements, the serially connected storage elements of each scan chain defining a circuit module boundary wherein all the serially connected storage elements of each scan chain are within the circuit module boundary;

using the address to couple the one serial scan chain selectively to an output scan chain wherein the output scan chain is a serially connected plurality of storage elements from a plurality of different circuit modules defined by the circuit module boundaries; and serially shifting the serial data stream into both the output scan chain and the one serial scan chain via the input terminal.

24. The method of claim 23 wherein the step of serially shifting comprises:

serially shifting deasserted values into an unselected serial scan chain, which is different from the one serial scan chain, while the serial data stream is being shifted into the one serial scan chain.

25. The method of claim 23 further comprising the step of:

placing the data processor into a serial shift mode to perform the step of serially shifting.

26. The method of claim 25 further comprising the step of:

placing the data processor into a parallel normal mode of operation after the step of serially shifting to alter a state of the data processor.

27. The method of claim 26 wherein the step of placing comprises:

serially shifting deasserted values into an unselected serial scan chain, which is different from the one serial scan chain, while the serial data stream is being shifted into the one serial scan chain; and continuing to serially shift deasserted values into the unselected serial scan chain during a time that the one serial scan chain is operating in the parallel normal mode of operation.

28. The method of claim 23 wherein the step of serially shifting comprises:

reducing logic transitions in other serial scan chains which are not selected by the step of providing an address.

* * * * *